(12) United States Patent
Zahurak et al.

(10) Patent No.: US 7,081,416 B2
(45) Date of Patent: Jul. 25, 2006

(54) METHODS OF FORMING FIELD EFFECT TRANSISTOR GATES

(75) Inventors: John K. Zahurak, Boise, ID (US); David K. Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 10/406,916

(22) Filed: Apr. 4, 2003

(65) Prior Publication Data

US 2004/0198058 A1    Oct. 7, 2004

(51) Int. Cl.
*H01L 21/302* (2006.01)

(52) U.S. Cl. .............. 438/720; 438/217; 438/230; 438/291; 438/706

(58) Field of Classification Search ........ 438/217, 438/230, 231, 232, 291, 509, 706, 710, 720
See application file for complete search history.

(56) References Cited

U.S. PATENT DOCUMENTS

| | | | |
|---|---|---|---|
| 4,977,100 A * | 12/1990 | Shimura | ........ 438/182 |
| 5,936,874 A | 8/1999 | Clampitt et al. | |
| 5,946,596 A * | 8/1999 | Ying | ........ 438/660 |
| 5,960,285 A * | 9/1999 | Hong | ........ 438/264 |
| 6,191,019 B1 * | 2/2001 | Liao et al. | ........ 438/592 |
| 6,281,064 B1 * | 8/2001 | Mandelman et al. | ........ 438/233 |
| 6,455,367 B1 | 9/2002 | Clampitt et al. | |

OTHER PUBLICATIONS

U.S. Appl. No. 09/971,250, filed Oct. 04, 2001, Agarwal.

* cited by examiner

*Primary Examiner*—Lan Vinh
(74) *Attorney, Agent, or Firm*—Wells St. John P.S.

(57) ABSTRACT

The invention includes methods of forming field effect transistor gates. In one implementation, a series of layers is formed proximate a semiconductive material channel region. The layers comprise a gate dielectric layer and a conductive metal-comprising layer having an ion implanted polysilicon layer received therebetween. Patterned masking material is formed over the series of layers. Using the patterned masking material as a mask, etching is conducted through the conductive metal-comprising layer and only partially into the ion implanted polysilicon layer. After such etching, the ion implanted polysilicon is annealed effective to electrically activate implanted impurity atoms received therein. Other aspects and implementations are contemplated.

44 Claims, 3 Drawing Sheets

METHODS OF FORMING FIELD EFFECT TRANSISTOR GATES

TECHNICAL FIELD

The invention relates to methods of forming field effect transistor gates.

BACKGROUND OF THE INVENTION

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to reduce the size of individual electronic components thereby enabling smaller and denser integrated circuitry.

One type of electronic device is a field effect transistor. Such includes a pair of source/drain regions having a channel region received therebetween. A conductive gate of the transistor is received transverse the channel region, and separated therefrom by a gate dielectric region. The flow of current through the channel between the source/drain regions is controlled by the application of a potential to the transistor gate. One common type of transistor gate construction includes a combination of conductively doped polysilicon and one or more higher electrically conductive layers.

One manner of forming a transistor gate is to form a succession of layers over what will be the source/drain and channel regions. One exemplary sequence of layers is a gate dielectric layer, thereover polysilicon, thereover tungsten nitride, thereover elemental tungsten and thereover silicon nitride. The silicon nitride can function as an insulative cap for the finished gate. In certain applications, it is desirable that the polysilicon of some of the transistor gates be doped with p-type material and the polysilicon of other of the transistor gates be doped with n-type material. Typically in such instances, the polysilicon layer is initially deposited in an undoped form. Thereafter, different portions of the polysilicon are masked and ion implanted with their respective p-type or n-type conductivity enhancing impurity atoms. The substrate is then annealed, for example by rapid thermal processing (RTP), effective to electrically activate the implanted impurity atoms received within the polysilicon layer.

Typically, photoresist is then deposited and patterned over the silicon nitride layer into a desired pattern. In one existing method, the photoresist is used as a mask while etching the desired pattern through the silicon nitride layer, the tungsten layer, and the tungsten nitride layer, but only partially into the activated ion implanted polysilicon. The typical anisotropic etching utilizes plasma and can use different chemistries depending upon the particular material being etched. The desired etching chemistry and conditions for etching completely through the polysilicon can have a tendency to damage or attack the gate sidewalls being formed and created by the etch of the tungsten and tungsten nitride layers. Accordingly, the photoresist is removed and a thin silicon nitride layer is typically deposited and anisotropically etched to form thin insulative sidewall spacers over the tungsten and tungsten nitride sidewalls as well as over the partially etched polysilicon. The etch can then be completed through the polysilicon using the silicon nitride cap as an etch mask, with the sidewall spacers protecting the tungsten and tungsten nitride sidewalls during the remaining polysilicon etch.

Unfortunately, the etch through the tungsten layers which goes partially into the polysilicon has been discovered to create undesirable wide and deep cracks in the outer polysilicon surface. The subsequently deposited silicon nitride tends to fill these cracks. The anisotropic etch to form the thin silicon nitride sidewall spacers may not remove all of the silicon nitride from within the cracks of the exposed polysilicon layer. Accordingly, the subsequent etch of the polysilicon has to also contend with the silicon nitride remaining in the cracks, and can lead to less-than-complete etching of the polysilicon, as well as other problems.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming field effect transistor gates. In one implementation, a series of layers is formed proximate a semiconductive material channel region. The layers comprise a gate dielectric layer and a conductive metal-comprising layer having an ion implanted polysilicon layer received therebetween. Patterned masking material is formed over the series of layers. Using the patterned masking material as a mask, etching is conducted through the conductive metal-comprising layer and only partially into the ion implanted polysilicon layer. After such etching, the ion implanted polysilicon is annealed effective to electrically activate implanted impurity atoms received therein.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
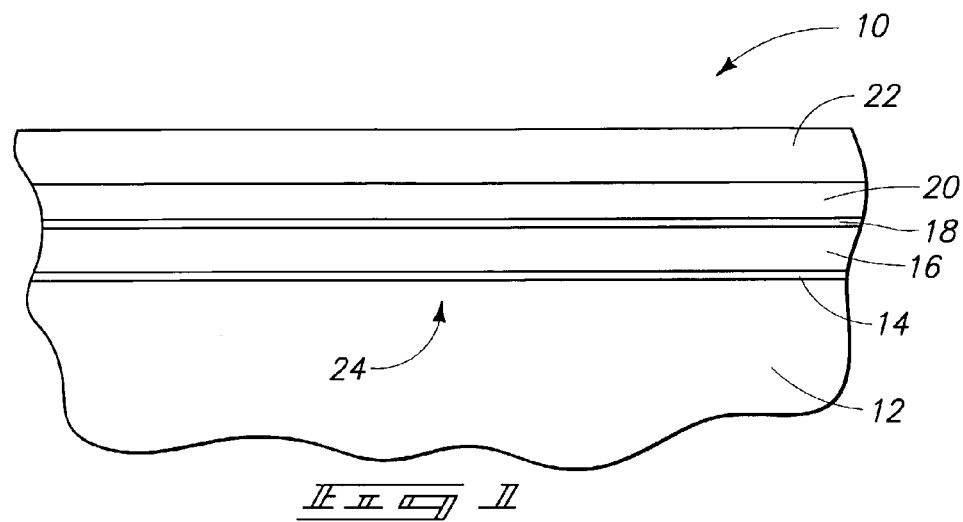
FIG. 1 is a diagrammatic sectional view of a semiconductor wafer fragment at a processing step in accordance with an aspect of the invention.

Methods of forming field effect transistor gates are described, by way of example only, with reference to FIGS. 1–7. Referring first to FIG. 1, such depicts a semiconductor wafer fragment 10 having a semiconductive substrate in the form of a bulk monocrystalline silicon region 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. For example although the invention is described with reference to bulk semiconductor processing, semiconductor-on-insulator substrates are of course also contemplated, as well as any other substrate, whether existing or yet-to-be developed.

FIG. 1 depicts a series of layers being formed over substrate material 12. Specifically, layer 14 is an exemplary gate dielectric layer. An example is thermally grown silicon dioxide having a thickness of from 20 Angstroms to 100 Angstroms. A polysilicon layer 16 is formed over gate dielectric layer 14. An example thickness is from 300 Angstroms to 600 Angstroms. Such is ion implanted or otherwise provided with a suitable conductivity enhancing impurity, but is not annealed to be electrically activated at this point. An exemplary n-type implant material is phosphorus, and an exemplary p-type material is boron. An exemplary implant dose is from $1 \times 10^{15}$ atoms/cm$^2$ to $9 \times 10^{15}$ atoms/cm$^2$.

Received over ion implanted polysilicon layer 16 are a tungsten nitride layer 18 and an elemental tungsten layer 20. An exemplary thickness range for layer 18 is from 20 Angstroms to 100 Angstroms, and an exemplary thickness range for tungsten layer 20 is from 50 Angstroms to 250 Angstroms. An insulative silicon nitride layer 22 is received over tungsten layer 20. An exemplary thickness for layer 22 is from 500 Angstroms to 2000 Angstroms. A region 24 of semiconductive material 12 will constitute a channel region therein for the field effect transistor being formed. Of course, more or fewer layers to those described above could be utilized. In one aspect, such can be considered as the forming of a series of layers proximate a semiconductive material channel region, with such layers comprising a gate dielectric layer and a conductive metal-comprising layer having an ion implanted polysilicon layer received therebetween. In the context of this document, "conductive metal" is defined to mean metal in elemental form, a conductive alloy of two or more elemental metals and/or a conductive metal compound. Accordingly, one or both of layers 20 and 18 can be considered as a conductive metal-comprising layer. In one preferred embodiment, the conductive metal-comprising layer comprises at least one of an elemental refractory metal, an alloy containing a refractory metal and a refractory metal compound, with the preferred elemental tungsten and tungsten nitride-comprising layers being exemplary preferred materials. Further in the exemplary depicted and preferred embodiment, ion implanted polysilicon layer 16 contacts gate dielectric layer 14 and conductive metal-comprising layer 18.

Figure 2:
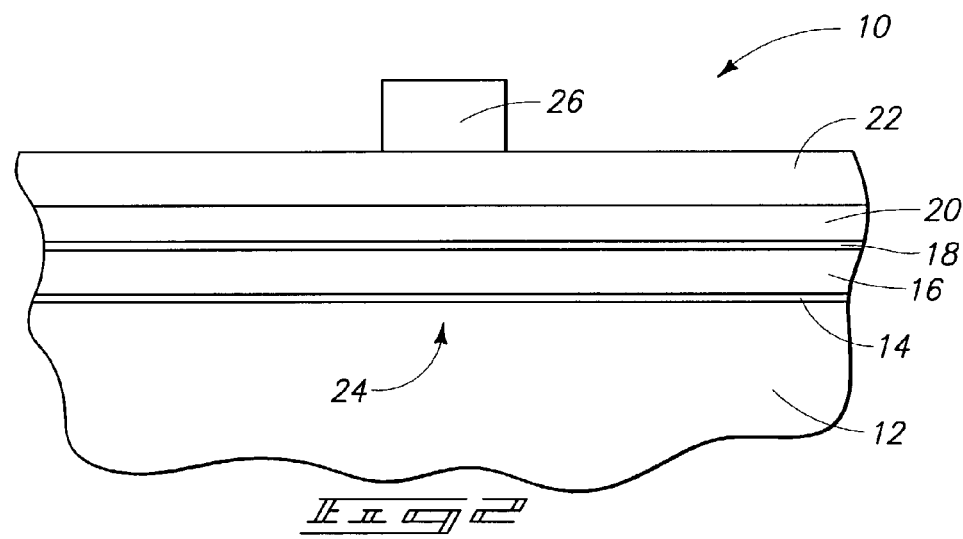
FIG. 2 is a view of the FIG. 1 wafer fragment at a processing step subsequent to that depicted by FIG. 1.

Referring to FIG. 2, a patterned masking material 26 has been formed over the series of layers 14, 16, 18, 20 and 22. A preferred material for mask 12 comprises photoresist. Exemplary silicon nitride insulative material 22 might be considered as part of or constituting masking material also, as in a preferred embodiment it can serve as a mask along with material 26 for etching material therebeneath, and as will be apparent from the continuing discussion.

Figure 3:
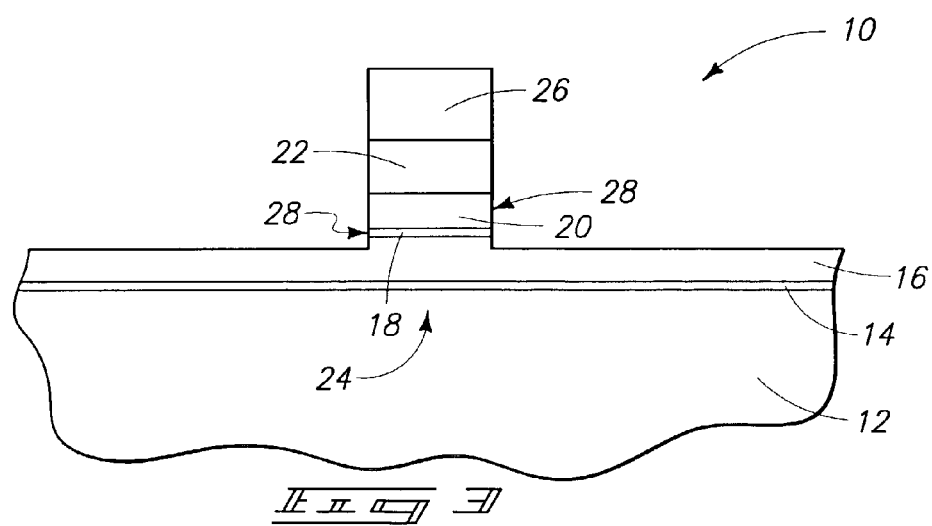
FIG. 3 is a view of the FIG. 2 wafer fragment at a processing step subsequent to that depicted by FIG. 2.

Referring to FIG. 3 and using patterned masking materials 26/22 as a mask, etching is conducted through conductive metal-comprising layer 20/18 and only partially into ion implanted polysilicon layer 16. An exemplary preferred etching chemistry for etching through material 22 includes $CF_4$ and preferably utilizes plasma conditions. An exemplary preferred chemistry that can be used to etch through the tungsten and tungsten nitride, and which will also etch at least partially into ion implanted polysilicon layer 16, includes $NF_3$ and preferably utilizes plasma conditions. Such etching forms exposed opposing conductive metal sidewalls 28 of conductive metal-comprising layers 20/18.

Figure 4:
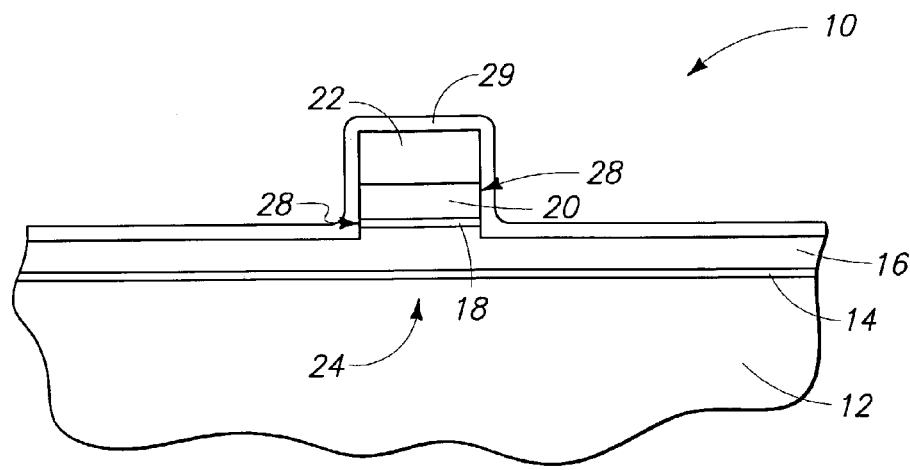
FIG. 4 is a view of the FIG. 3 wafer fragment at a processing step subsequent to that depicted by FIG. 3.

Referring to FIG. 4, patterned masking material 26 has been removed. A spacer-forming electrically insulative material 29 has been deposited. In one preferred embodiment, the FIG. 4 illustrated substrate is subjected to suitable annealing conditions to anneal the ion implanted polysilicon material 16 effective to electrically activate implanted impurity atoms received therein. An exemplary preferred annealing is by rapid thermal processing. A specific example includes a ramp from room temperature to 950° C. over 1 to 2 seconds, and maintaining such temperature for approximately 20 seconds at ambient pressure and in an inert atmosphere. Further in the described preferred embodiment, any photoresist has been removed from the substrate prior to such annealing. Further in one considered aspect, annealing of the ion implanted polysilicon effective to electrically activate implanted impurity atoms received therein occurs at a time or while the ion implanted polysilicon layer has been etched into only partially.

Figure 5:
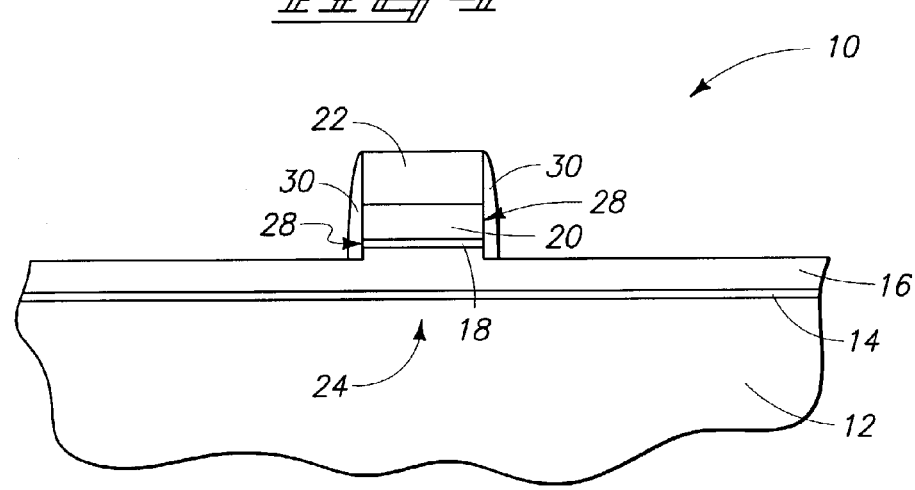
FIG. 5 is a view of the FIG. 4 wafer fragment at a processing step subsequent to that depicted by FIG. 4.

Referring to FIG. 5, spacer-forming layer 29 has been anisotropically etched to form insulative material sidewall spacers 30 over exposed opposing conductive metal sidewalls 28 and over partially etched ion implanted polysilicon 16. It has been discovered that conducting the exemplary FIG. 3 etching only partially into the polysilicon prior to conducting an electrically activating anneal of the ion implanted material therein can result in a more uniform, smoother, upper surface of the ion implanted polysilicon which has significantly reduced/less severe crack formation. Accordingly, much more or substantially complete removal of silicon nitride in the formation of spacers 30 can be achieved. In one implementation, spacers 30 can be considered as first sidewall spacers where a second-in-time spacer or spacers will be formed, as occurs in the preferred embodiment in accordance with the continuing discussion.

Figure 6:
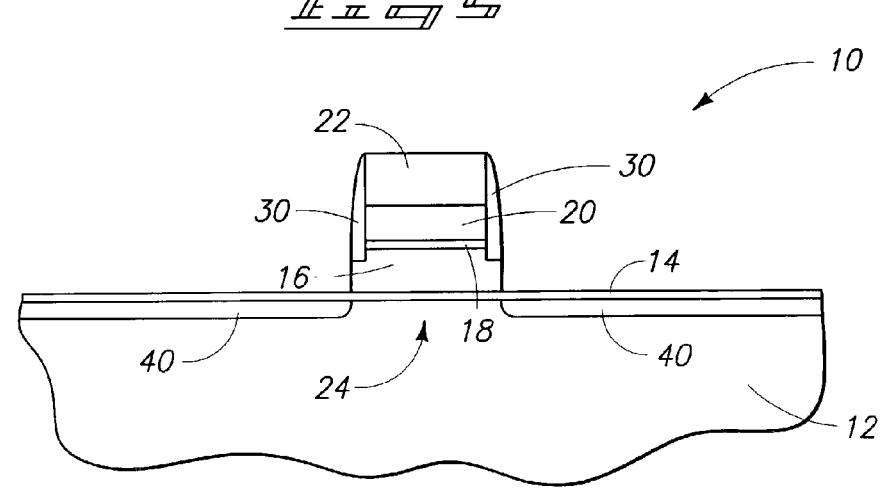
FIG. 6 is a view of the FIG. 5 wafer fragment at a processing step subsequent to that depicted by FIG. 5.

Referring to FIG. 6 and after the annealing, etching has been conducted completely through the remaining of ion implanted polysilicon later 16. An exemplary preferred etching is plasma etching, for example utilizing a HBr chemistry. Preferably, LDD or other source/drain implants 40 are provided. Then, a source/drain reoxidation is preferably conducted.

Figure 7:
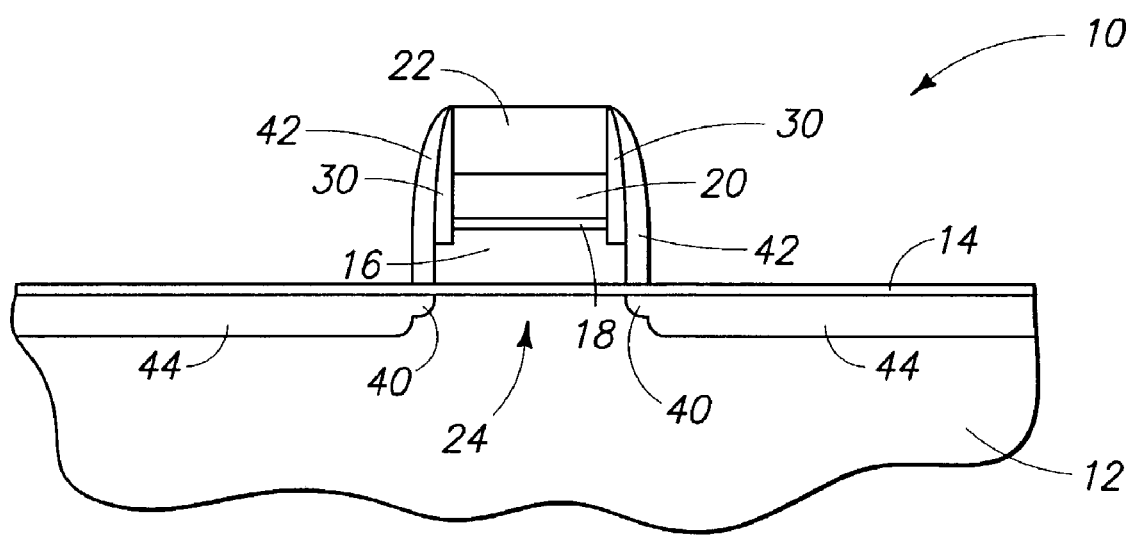
FIG. 7 is a view of the FIG. 5 wafer fragment at a processing step subsequent to that depicted by FIG. 5.

Referring to FIG. 7, anisotropically etched insulative material sidewall spacers 42 have been formed. An exemplary preferred material is silicon nitride. When first anisotropically etched sidewall spacers 30 are utilized, sidewall spacers 42 can be considered as second sidewall spacers formed over first sidewall spacers 30. The use of "first" and "second" in the description of such preferred embodiment spacers is intended to only refer to the time sequence relative to each other, not necessarily being the first ever and the second ever formed spacers over the subject transistor gate or elsewhere on the substrate. FIG. 7 also depicts additional source/drain implanting to form regions 44. Further as is apparent in the preferred embodiment depiction, at least some of insulating material 22 which also served to mask layers therebeneath during aspects of the etching remains as part of the final construction of the circuitry being fabricated. The above-described preferred embodiment forms anisotropically etched insulative material sidewall spacers over sidewalls of the conductive metal-comprising layer both before (i.e., spacers 30) and after (i.e., spacers 42) the annealing.

The above-described processing discloses but only exemplary various preferred embodiments. However, the invention is only limited by the accompanying claims without interpretative or limiting reference to the specification, and in accordance with the doctrine of equivalents. Further by way of example only, the above-described annealing to electrically activate the implanted impurity atoms might be conducted at other times after the partial etch into the polysilicon. For example and by way of example only, the annealing could be conducted after the complete polysilicon etch, for example immediately thereafter or after a source/drain re-oxidation and before second spacer 42 formation, or even after second spacer 42 formation. Accordingly and by way of example only, the etching could be conducted completely through the ion implanted polysilicon after forming the sidewall spacers and before the annealing. Further, the process might be practiced without the formation of one or either of spacers 30 and 42 in certain aspects.

The prior art is understood to have taught the formation of a transistor gate in SRAM whereby an electrical activation anneal is conducted after gate formation, but not in the formation of a partial polysilicon etch step first, nor in conjunction with forming insulative spacers 30.

An advantage to conducting the electrical activation after partially etching into the polysilicon but prior to completely etching throughout is less loss of implanted dopant from the polysilicon portion of the gate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field effect transistor gate, comprising:
    forming a series of layers proximate a semiconductive material channel region, the layers comprising a gate dielectric layer and a conductive metal-comprising layer having an ion implanted polysilicon layer received therebetween;
    forming masking material over the series of layers;
    patterning the masking material over the series of layers, the polysilicon having been ion implanted with conductivity enhancing impurity prior to said patterning;
    using the patterned masking material as a mask, etching completely through the conductive metal-comprising layer and only partially through the ion implanted polysilicon layer; and
    when the ion implanted polysilicon layer has been only partially etched through, annealing the ion implanted polysilicon effective to electrically activate implanted impurity atoms received therein, the annealed polysilicon comprising a portion of the field effect transistor gate.

2. The method of claim 1 wherein the ion implanted polysilicon layer contacts the gate dielectric layer and the conductive metal-comprising layer.

3. The method of claim 1 wherein the conductive metal-comprising layer comprises at least one of an elemental refractory metal, an alloy containing a refractory metal and a refractory metal compound.

4. The method of claim 1 wherein the conductive metal-comprising layer comprises an elemental metal.

5. The method of claim 1 wherein the conductive metal-comprising layer comprises an alloy.

6. The method of claim 1 wherein the conductive metal-comprising layer comprises a metal compound.

7. The method of claim 1 wherein the conductive metal-comprising layer comprises tungsten.

8. The method of claim 7 wherein the tungsten comprises elemental tungsten.

9. The method of claim 7 wherein the tungsten comprises tungsten nitride.

10. The method of claim 1 comprising removing at least a portion of the patterned masking material before the annealing.

11. The method of claim 1 wherein the patterned masking material comprises photoresist.

12. The method of claim 1 wherein the patterned masking material comprises sacrificial photoresist and an insulative material received over the conductive metal-comprising layer, at least some of the insulative material received over the conductive metal-comprising layer remaining as part of a final construction of fabricated circuitry.

13. The method of claim 1 wherein the patterned masking material comprises sacrificial photoresist and an insulative material received over the conductive metal-comprising layer, at least some of the insulative material received over the conductive metal-comprising layer remaining as part of a final construction of fabricated circuitry, and removing the sacrificial photoresist before the annealing.

14. The method of claim 1 wherein the annealing comprises rapid thermal processing.

15. A method of forming a field effect transistor gate, comprising:
    forming a series of layers proximate a semiconductive material channel region, the layers comprising a gate dielectric layer and a conductive metal-comprising layer having an ion implanted polysilicon layer received therebetween;
    forming masking material over the series of layers;
    patterning the masking material over the series of layers, the polysilicon having been ion implanted with conductivity enhancing impurity prior to said patterning;
    using the patterned masking material as a mask, etching through the conductive metal-comprising layer and only partially into the ion implanted polysilicon layer;
    when the ion implanted polysilicon layer has been only partially etched into, annealing the ion implanted polysilicon effective to electrically activate implanted impurity atoms received therein, the annealed polysilicon comprising a portion of the field effect transistor gate; and
    etching completely through the activated ion implanted polysilicon after the annealing.

16. A method of forming a field effect transistor gate, comprising:

forming a series of layers proximate a semiconductive material channel region, the layers comprising a gate dielectric layer and a conductive metal-comprising layer having an ion implanted polysilicon layer received therebetween;

forming masking material over the series of layers;

patterning the masking material over the series of layers, the polysilicon having been ion implanted with conductivity enhancing impurity prior to said patterning;

using the patterned masking material as a mask, etching through the conductive metal-comprising layer and only partially into the ion implanted polysilicon layer;

when the ion implanted polysilicon layer has been only partially etched into, annealing the ion implanted polysilicon effective to electrically activate implanted impurity atoms received therein, the annealed polysilicon comprising a portion of the field effect transistor gate; and forming anisotropically etched insulative material sidewall spacers over sidewalls of the conductive metal-comprising layer before the annealing.

17. The method of claim 1 further comprising forming anisotropically etched insulative material sidewall spacers over sidewalls of the conductive metal-comprising layer after the annealing.

18. The method of claim 17 comprising depositing the insulative material, then conducting said annealing, and then anisotropically etching the insulative material to form the sidewall spacers.

19. A method of forming a field effect transistor gate, comprising:

forming a series of layers proximate a semiconductive material channel region, the layers comprising a gate dielectric layer and a conductive metal-comprising layer having an ion implanted polysilicon layer received therebetween;

forming masking material over the series of layers;

patterning the masking material over the series of layers, the polysilicon having been ion implanted with conductivity enhancing impurity prior to said patterning;

using the patterned masking material as a mask, etching completely through the conductive metal-comprising layer and only partially through the ion implanted polysilicon layer, the etching completely through the conductive metal-comprising layer forming exposed opposing conductive metal sidewalls;

forming anisotropically etched insulative material sidewall spacers over the exposed opposing conductive metal sidewalls and over the partially etched ion implanted polysilicon; and after forming the anisotropically etched insulative material sidewall spacers, annealing the ion implanted polysilicon effective to electrically activate implanted impurity atoms received therein, the annealed polysilicon comprising a portion of the field effect transistor gate.

20. A method of forming a field effect transistor gate, comprising:

forming a series of layers proximate a semiconductive material channel region, the layers comprising a gate dielectric layer and a conductive metal-comprising layer having an ion implanted polysilicon layer received therebetween;

forming masking material over the series of layers;

patterning the masking material over the series of layers, the polysilicon having been ion implanted with conductivity enhancing impurity prior to said patterning;

using the patterned masking material as a mask, etching through the conductive metal-comprising layer and only partially into the ion implanted polysilicon layer, the etching through the conductive metal-comprising layer forming exposed opposing conductive metal sidewalls;

forming anisotropically etched insulative material sidewall spacers over the exposed opposing conductive metal sidewalls and over the partially etched ion implanted polysilicon;

after forming the anisotropically etched insulative material sidewall spacers, annealing the ion implanted polysilicon effective to electrically activate implanted impurity atoms received therein, the annealed polysilicon comprising a portion of the field effect transistor gate; and etching completely through the activated ion implanted polysilicon after the annealing.

21. A method of forming a field effect transistor gate, comprising:

forming a series of layers proximate a semiconductive material channel region, the layers comprising a gate dielectric layer and a conductive metal-comprising layer having an ion implanted polysilicon layer received therebetween;

forming masking material over the series of layers;

patterning the masking material over the series of layers, the polysilicon having been ion implanted with conductivity enhancing impurity prior to said patterning;

using the patterned masking material as a mask, etching through the conductive metal-comprising layer and only partially into the ion implanted polysilicon layer, the etching through the conductive metal-comprising layer forming exposed opposing conductive metal sidewalls;

forming anisotropically etched insulative material sidewall spacers over the exposed opposing conductive metal sidewalls and over the partially etched ion implanted polysilicon;

after forming the anisotropically etched insulative material sidewall spacers, annealing the ion implanted polysilicon effective to electrically activate implanted impurity atoms received therein, the annealed polysilicon comprising a portion of the field effect transistor gate; and etching completely through the ion implanted polysilicon after forming the sidewall spacers and before the annealing.

22. The method of claim 19 wherein the conductive metal-comprising layer comprises tungsten.

23. The method of claim 22 wherein the tungsten comprises elemental tungsten.

24. The method of claim 22 wherein the tungsten comprises tungsten nitride.

25. The method of claim 19 comprising removing at least a portion of the patterned masking material before the annealing.

26. The method of claim 19 wherein the patterned masking material comprises photoresist.

27. The method of claim 19 wherein the patterned masking material comprises sacrificial photoresist and an insulative material received over the conductive metal-comprising layer, at least some of the insulative material received over the conductive metal-comprising layer remaining as part of a final construction of fabricated circuitry.

28. The method of claim 19 wherein the patterned masking material comprises sacrificial photoresist and an insulative material received over the conductive metal-comprising layer, at least some of the insulative material received over the conductive metal-comprising layer remaining as part of a final construction of fabricated circuitry, and removing the sacrificial photoresist before the annealing.

29. A method of forming a field effect transistor gate, comprising:
   forming a series of layers proximate a semiconductive material channel region, the layers comprising a gate dielectric layer and a conductive metal-comprising layer having an ion implanted polysilicon layer received therebetween;
   forming masking material over the series of layers;
   patterning the masking material over the series of layers, the polysilicon having been ion implanted with conductivity enhancing impurity prior to said patterning;
   using the patterned masking material as a mask, etching through the conductive metal-comprising layer and only partially into the ion implanted polysilicon layer, the etching through the conductive metal-comprising layer forming exposed opposing conductive metal sidewalls;
   forming first anisotropically etched insulative material sidewall spacers over the exposed opposing conductive metal sidewalls and over the partially etched ion implanted polysilicon;
   after forming the first anisotropically etched insulative material sidewall spacers, annealing the ion implanted polysilicon effective to electrically activate implanted impurity atoms received therein, the annealed polysilicon comprising a portion of the field effect transistor gate;
   after the annealing, etching completely through remaining of the ion implanted polysilicon layer and through the gate dielectric layer; and
   after the etching completely, forming second anisotropically etched insulative material sidewall spacers over the first anisotropically etched sidewall spacers.

30. The method of claim 29 wherein the conductive metal-comprising layer comprises tungsten.

31. The method of claim 30 wherein the tungsten comprises elemental tungsten.

32. The method of claim 30 wherein the tungsten comprises tungsten nitride.

33. The method of claim 29 comprising removing at least a portion of the patterned masking material before the annealing.

34. The method of claim 29 wherein the patterned masking material comprises photoresist.

35. The method of claim 29 wherein the patterned masking material comprises sacrificial photoresist and an insulative material received over the conductive metal-comprising layer, at least some of the insulative material received over the conductive metal-comprising layer remaining as part of a final construction of fabricated circuitry.

36. The method of claim 29 wherein the patterned masking material comprises sacrificial photoresist and an insulative material received over the conductive metal-comprising layer, at least some of the insulative material received over the conductive metal-comprising layer remaining as part of a final construction of fabricated circuitry, and removing the sacrificial photoresist before the annealing.

37. A method of forming a field effect transistor gate, comprising:
   forming a series of layers proximate a semiconductive material channel region, the layers comprising a gate dielectric layer and a conductive metal-comprising layer having an ion implanted polysilicon layer received therebetween;
   forming masking material over the series of layers;
   patterning the masking material over the series of layers, the polysilicon having been ion implanted with conductivity enhancing impurity prior to said patterning;
   using the patterned masking material as a mask, etching through the conductive metal-comprising layer and only partially into the ion implanted polysilicon layer, the etching through the conductive metal-comprising layer forming exposed opposing conductive metal sidewalls;
   forming first anisotropically etched insulative material sidewall spacers over the exposed opposing conductive metal sidewalls and over the partially etched ion implanted polysilicon;
   after forming the first anisotropically etched insulative material sidewall spacers, etching completely through remaining of the ion implanted polysilicon layer and through the gate dielectric layer;
   after the etching completely, forming second anisotropically etched insulative material sidewall spacers over the first anisotropically etched sidewall spacers; and
   after forming the second anisotropically etched sidewall spacers, annealing the ion implanted polysilicon effective to electrically activate implanted impurity atoms received therein, the annealed polysilicon comprising a portion of the field effect transistor gate.

38. The method of claim 37 wherein the conductive metal-comprising layer comprises tungsten.

39. The method of claim 38 wherein the tungsten comprises elemental tungsten.

40. The method of claim 38 wherein the tungsten comprises tungsten nitride.

41. The method of claim 37 comprising removing at least a portion of the patterned masking material before the annealing.

42. The method of claim 37 wherein the patterned masking material comprises photoresist.

43. The method of claim 37 wherein the patterned masking material comprises sacrificial photoresist and an insulative material received over the conductive metal-comprising layer, at least some of the insulative material received over the conductive metal-comprising layer remaining as part of a final construction of fabricated circuitry.

44. The method of claim 37 wherein the patterned masking material comprises sacrificial photoresist and an insulative material received over the conductive metal-comprising layer, at least some of the insulative material received over the conductive metal-comprising layer remaining as part of a final construction of fabricated circuitry, and removing the sacrificial photoresist before the annealing.

* * * * *